(12) United States Patent
Tung (10) Patent No.: US 6,429,077 B1
(45) Date of Patent: Aug. 6, 2002

(54) METHOD OF FORMING A LATERAL DIFFUSED METAL-OXIDE SEMICONDUCTOR TRANSISTOR

(75) Inventor: Ming-Tsung Tung, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/452,106

(22) Filed: Dec. 2, 1999

(51) Int. Cl.[7] .............................................. H01L 21/336
(52) U.S. Cl. ...................... 438/270; 438/286; 438/443; 438/545
(58) Field of Search ................. 438/138, 268, 438/270, 286, 297, 443, 527, 529, 545

(56) References Cited

U.S. PATENT DOCUMENTS 5,578,514 A * 11/1996 Kwon et al. ................ 438/286
5,831,320 A * 11/1998 Kwon et al. ................ 438/297
6,093,588 A * 7/2000 De Petro et al. ............ 438/297

FOREIGN PATENT DOCUMENTS

GB 2295052 * 5/1996

* cited by examiner

*Primary Examiner*—Chandra Chaudhari
(74) *Attorney, Agent, or Firm*—Winston Hsu (57) ABSTRACT

The present invention provides a method of forming a lateral diffused metal-oxide semiconductor (LD MOS) transistor on a semiconductor wafer. An ion implantation process is performed on a predetermined area of the silicon substrate so as to form a p-well adjacent to an n-well. An insulation layer is then formed on a predetermined area of the n-well. A gate layer is formed on a portion of the p-well and the n-well, and one side of the gate layer is positioned on the surface of the insulation layer. Finally, an ion implantation process is performed to form two n-type doped regions on the p-well and the n-well. The two doped regions are used as the source and the drain of the LD MOS transistor.

11 Claims, 8 Drawing Sheets

METHOD OF FORMING A LATERAL DIFFUSED METAL-OXIDE SEMICONDUCTOR TRANSISTOR

BACKGROUND OF THE INVENTION

1. Field of the Invention

The present invention relates to a method of forming a metal-oxide semiconductor (MOS) transistor on a semiconductor wafer, and more particularly, to a lateral diffused metal-oxide semiconductor (LD MOS) transistor.

2. Description of the Prior Art

Metal-oxide semiconductor (MOS) transistors that consume less power and that can be highly integrated are widely used in the semiconductor industry. When a proper voltage is inputted, MOS transistors can be used as a kind of switch to control the flow of electricity through a device. In high voltage circuits, such as the input and output terminals of electrical equipment, LD MOS transistors are commonly used because of their ability to withstand heavy loads. As the development of integrated circuits progresses, controlling the manufacturing process of LD MOS transistors becomes an increasingly important issue.

Please refer to FIG. 1 to FIG. 6. FIG. 1 to FIG. 6 are cross-sectional diagrams of a method of forming a prior art LD MOS transistor 11. A semiconductor wafer 10 comprises a silicon substrate 12. In the method of forming the prior art LD MOS transistor 11, the semiconductor wafer 10 is first placed into a thermal oxidation furnace. A thermal oxidation process is performed to grow a silicon oxide layer 14, around 200 to 400 angstroms thick, on the surface of the silicon substrate 12. The silicon oxide layer 14 functions as a sacrificial oxide layer in a subsequent ion implantation process to increase the scattering of ions so as to prevent channeling. The silicon oxide layer 14 also functions as a pad oxide layer to promote the adherence between a subsequent silicon nitride layer and the silicon substrate 12.

Figure 1:
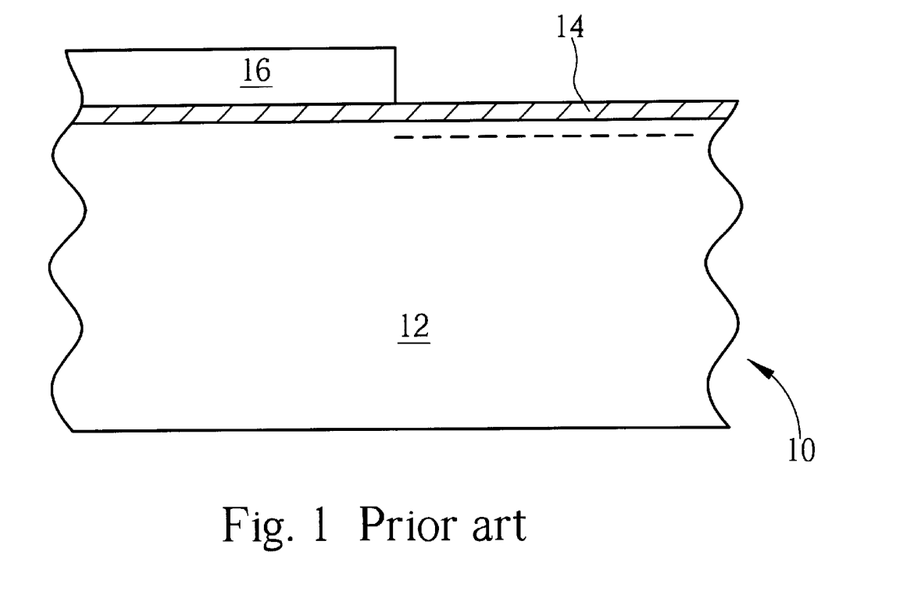
FIG. 1 to FIG. 6 are cross-sectional diagrams of a method of forming an LD MOS transistor according to the prior art.
Figure 2:
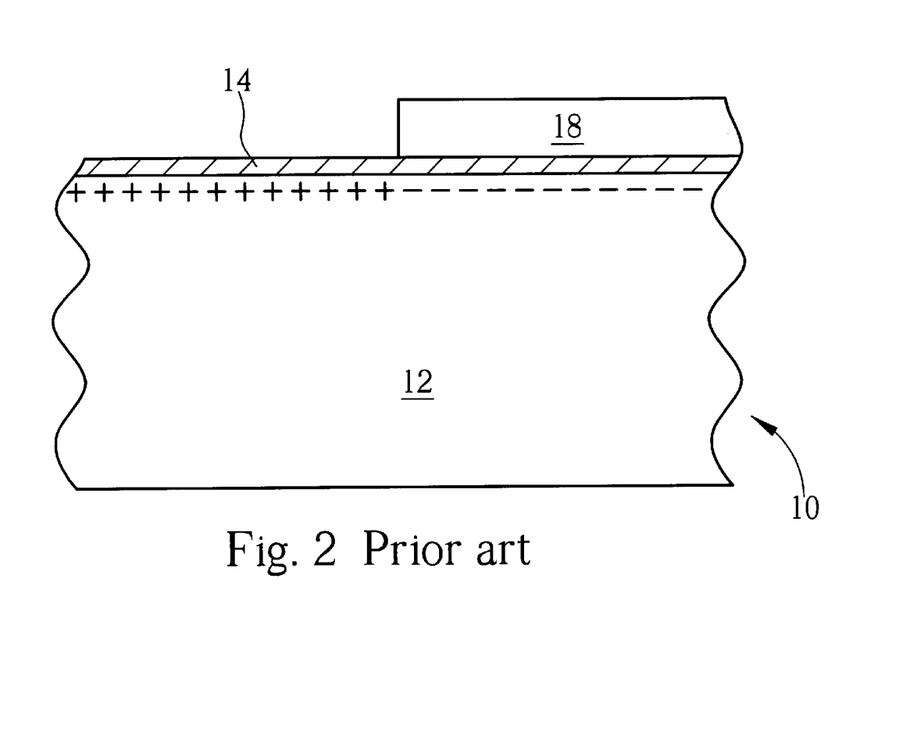

A photoresist layer 16 is coated onto the semiconductor wafer 10, and a lithographic process is performed to define the ion implantation area of an n-well. An ion implantation process is performed to dope n-type dopants into the semiconductor wafer 10. Then the photoresist layer 16 is stripped. As shown in FIG. 2, the steps described above are performed again to form a photoresist layer 18 that defines the ion implantation area of a p-well adjacent to the n-well. Then p-type dopants are doped into the semiconductor wafer 10 and the photoresist layer 18 is stripped.

Figure 3:
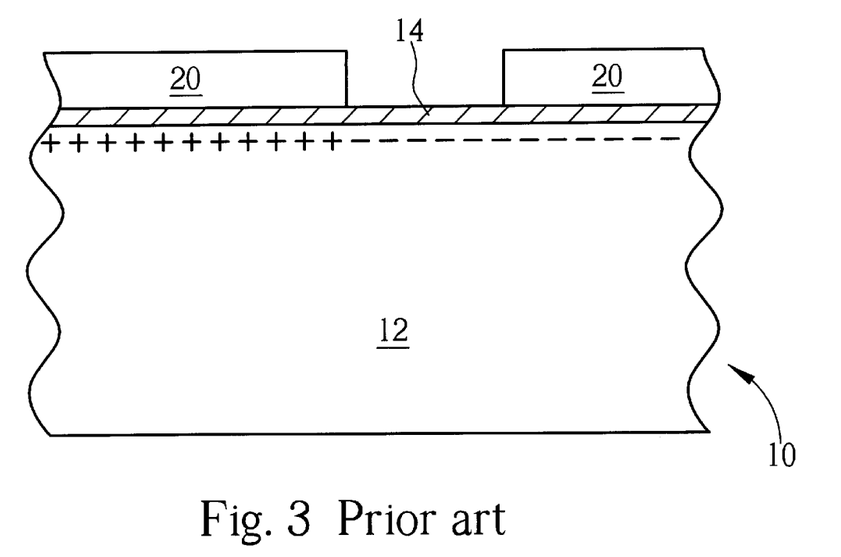
Figure 4:
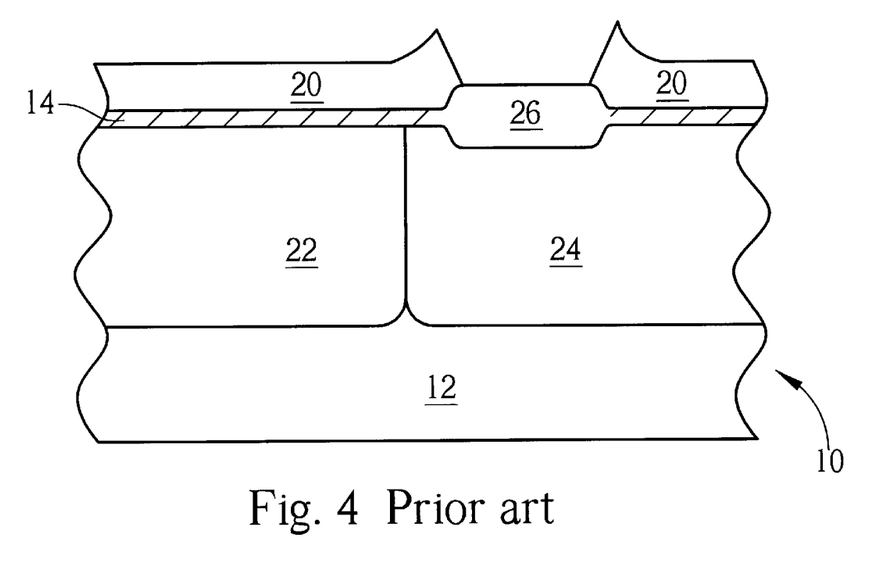

As shown in FIG. 3, a thin film deposition process is performed using a chemical vapor deposition method to form a silicon nitride layer 20 on the silicon oxide layer 14. A lithographic process is performed to define the area which is predetermined for the formation of a field oxide layer. A dry etching process is then performed to remove the silicon nitride layer 20 in the predetermined area. Taking advantage of silicon nitride, which prevents diffusion of oxygen and water, the silicon nitride layer 20 is used as the mask in a local oxidation of silicon (LOCOS) process that forms the field oxide layer. As shown in FIG. 4, a wet oxidation process is performed to grow the field oxide layer 26 in the presence of water and oxygen, simultaneously using thermal diffusion to drive the p-type and n-type dopants into the silicon substrate 12 so as to form the p-well 22 and the n-well 24. The silicon nitride layer 20 is then stripped using a heated phosphoric acid solution.

Figure 5:
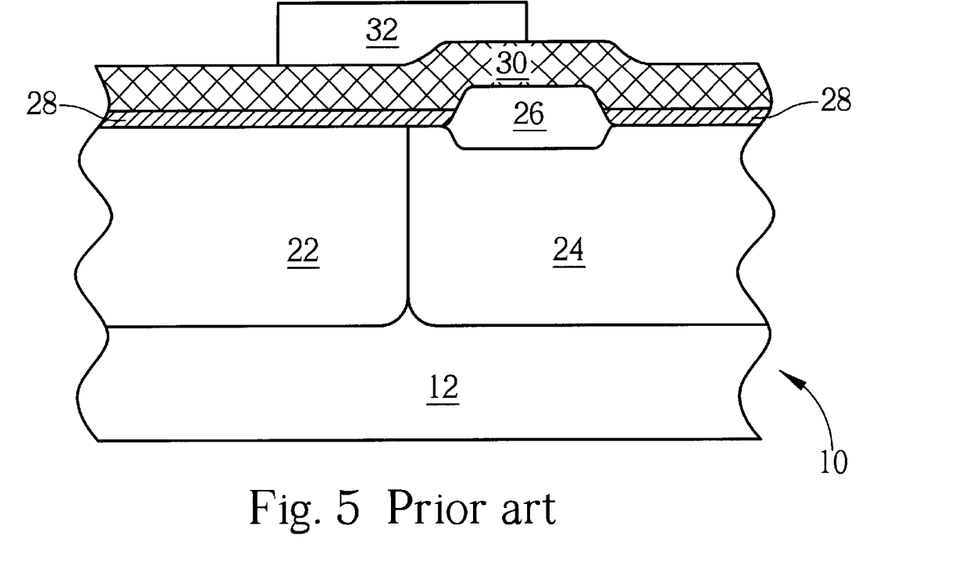
Figure 6:
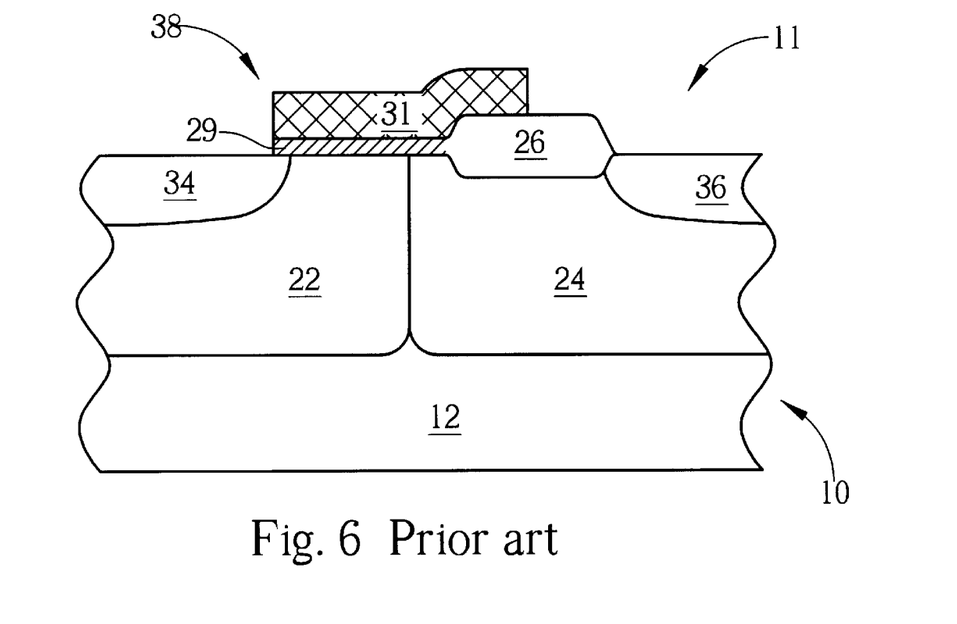

As shown in FIG. 5, the gate oxide layer and the gate conductive layer of the LD MOS transistor are next formed. The residual silicon oxide layer 14 is removed completely using a wet etching process. Then, the silicon surface, which has suffered atmospheric exposure, is cleaned to ensure its quality. After the cleaning process, the semiconductor wafer 10 is placed into the thermal oxidation furnace again to form a silicon oxide layer 28, around 100 to 250 angstroms thick, on the active area using a dry oxidation process. A polysilicon layer 30, around 2000 to 3000 angstroms thick, is deposited onto the silicon oxide layer 28 using an LPCVD process. A thermal diffusion method or an ion implantation process is then performed to heavily dope the polysilicon layer 30 so as to reduce the resistivity of the polysilicon layer 30. The polysilicon layer 30 is utilized as a subsequent gate conductive layer 31 (FIG. 6). A lithographic process is performed to define a gate layer 38 using a photoresist layer 32.

Please refer to FIG. 6. A dry etching process is performed to remove both the polysilicon layer 30 and the silicon oxide layer 28 that are not within the area of the gate. The photoresist layer 32 is then stripped. The residual polysilicon layer 30 forms the gate conductive layer 31, and the residual silicon oxide layer 28 forms a gate oxide layer 29. Hence, the gate layer 38 comprises the gate oxide layer 29 and the doped polysilicon gate conductive layer 31. Also, the gate layer 38 is positioned on a portion of both the p-well 22 and the n-well 24, and one side of the gate layer 38 is positioned on the field oxide layer 26. A lithographic process and an ion implantation process are performed on the p-well 22 and the n-well 24 to form heavily doped n-type doped regions 34 and 36. The n-type doped region 34 is adjacent to one side of the gate layer 38 and the other n-type doped region 36 is adjacent to the field oxide layer 26. The n-type doped regions 34 and 36 function as the source and the drain of the LD MOS transistor.

In the method of forming the prior art LD MOS transistor 11, a portion of the silicon oxide layer 14 under the silicon nitride layer 20 will be oxidized due to the diffusion of water and oxygen during the thermal oxidation process of forming the field oxide layer 26. Consequently, a bird's beak is formed in the region adjacent to the silicon nitride layer 20. Because the scale of the bird's beak cannot be precisely controlled, the length of the field oxide layer 26 is also not of a precise length. In the prior art method, the n-type doped region 36, used as the drain, is positioned beside the field oxide layer 26, so the channel length, which is defined as the length from the source 34 to the drain 36 of the LD MOS transistor 11, is determined by the length of the field oxide layer 26. As a result, the on-resistance of the LD MOS transistor 11 cannot be precisely controlled, affecting the entire electrical performance of the LD MOS transistor.

SUMMARY OF THE INVENTION

It is therefore a primary objective of the present invention to provide a method of forming an LD MOS transistor on a semiconductor wafer to solve the above mentioned problem.

In a preferred embodiment, the present invention provides a method of forming an LD MOS transistor on a semiconductor wafer with a silicon substrate. An ion implantation process is performed on a predetermined area of the silicon substrate so as to form a p-well and an n-well, with the p-well adjacent to the n-well. A field oxide layer is formed to act as an insulation layer on a predetermined area of the n-well. A gate layer is formed on a portion of the p-well and the n-well, with one side of the gate layer positioned on the surface of the insulation layer. Finally, an ion implantation process is performed to form two doped regions on the p-well and the n-well. The two doped regions are used as the source and the drain of the LD MOS transistor.

It is an advantage of the present invention method that the channel length of the LD MOS transistor can be precisely controlled, so the on-resistance of the LD MOS transistor can also be well controlled. The p-well and the n-well of lower dosage dopants adjust the threshold voltage of the LD MOS transistor, and the region of higher dosage dopants enhances both the current, and the magnitude of the electrical field. Consequently, the present invention improves the electrical performance of the LD MOS transistor.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENT

Figure 7:
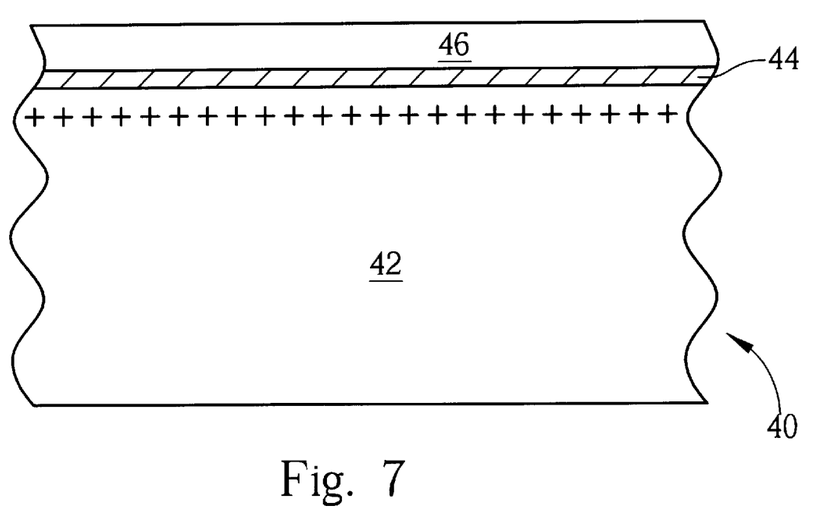
FIG. 7 to FIG. 16 are cross-sectional diagrams of a method of forming an LD MOS transistor on a semiconductor wafer according to the present invention.

Please refer to FIG. 7 to FIG. 16. FIG. 7 to FIG. 16 are cross-sectional diagrams of a method of forming an LD MOS transistor 41 on a semiconductor wafer 40 according to the present invention. As shown in FIG. 7, the semiconductor wafer 40 comprises a silicon substrate 42. The semiconductor wafer 40 is placed into a thermal oxidation furnace to grow a silicon oxide layer 44, around 200 to 400 angstroms thick, on the silicon substrate 42 using a thermal oxidation process. The silicon oxide layer 44 is used as a sacrificial layer during an ion implantation process and also as a pad oxide layer. An ion implantation process is performed to implant p-type dopants into the semiconductor wafer 40. A thin film deposition process follows using a CVD method to form a silicon nitride layer 46 on the silicon oxide layer 44. The silicon nitride layer 46 acts as a mask in a subsequent LOCOS process of forming a field oxide layer.

Figure 8:
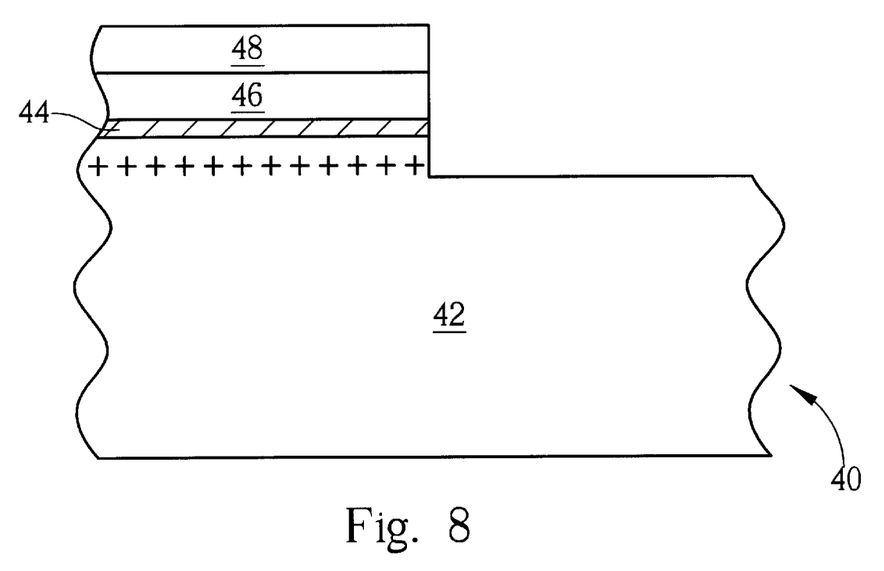
Figure 9:
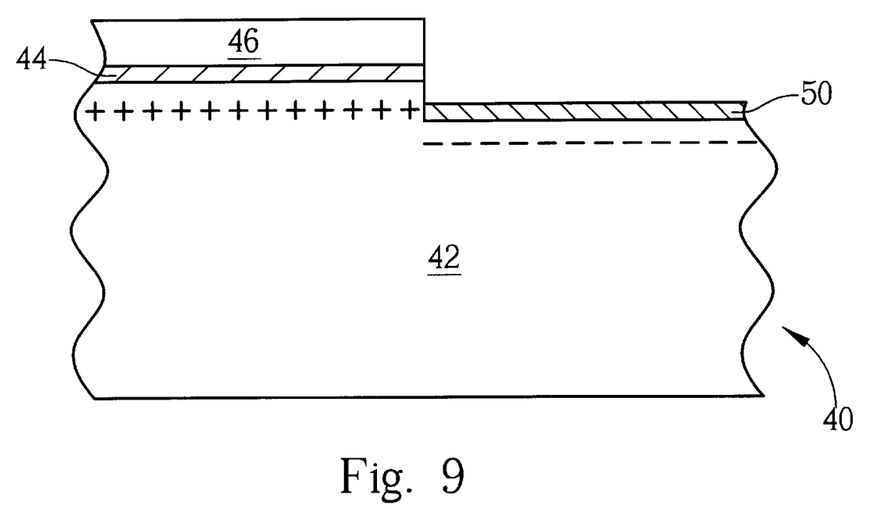

As shown in FIG. 8, a lithographic process is performed. A photoresist layer 48 is coated onto the wafer 40 to define a doped region. Then an etching process is performed to remove the silicon nitride layer 46 and the silicon oxide layer 44 not covered by the photoresist layer 48. The etching process proceeds down to a predetermined depth so as to remove the region that had been implanted with p-type dopants. Hence, the surface of the silicon substrate 42 will be step-shaped. The photoresist layer 48 is stripped. Using the silicon nitride layer 46 as a mask, a thermal oxidation process is performed to form a silicon oxide layer 50. The silicon oxide layer 50 acts as a sacrificial layer for the following ion implantation process. The ion implantation process implants n-type dopants into the area not covered by the silicon nitride layer 46, as shown in FIG. 9.

Figure 10:
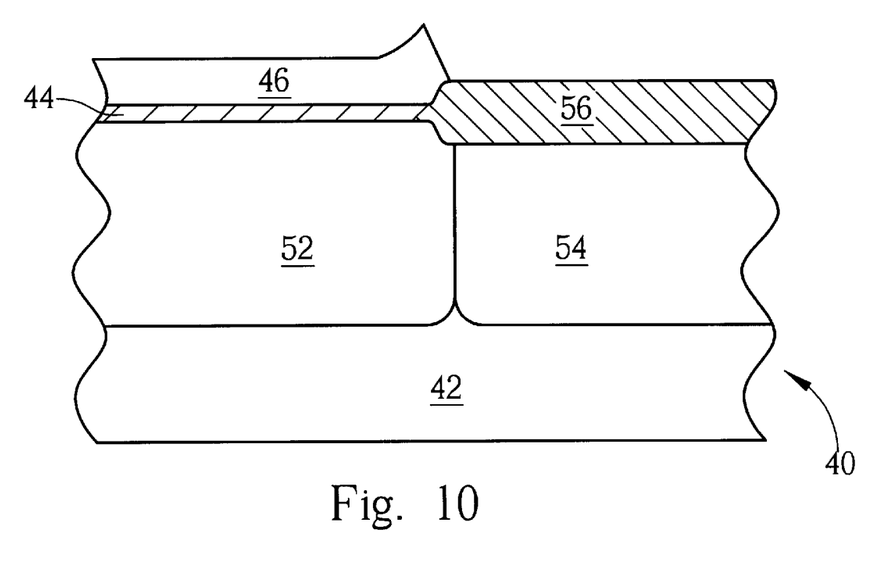
Figure 11:
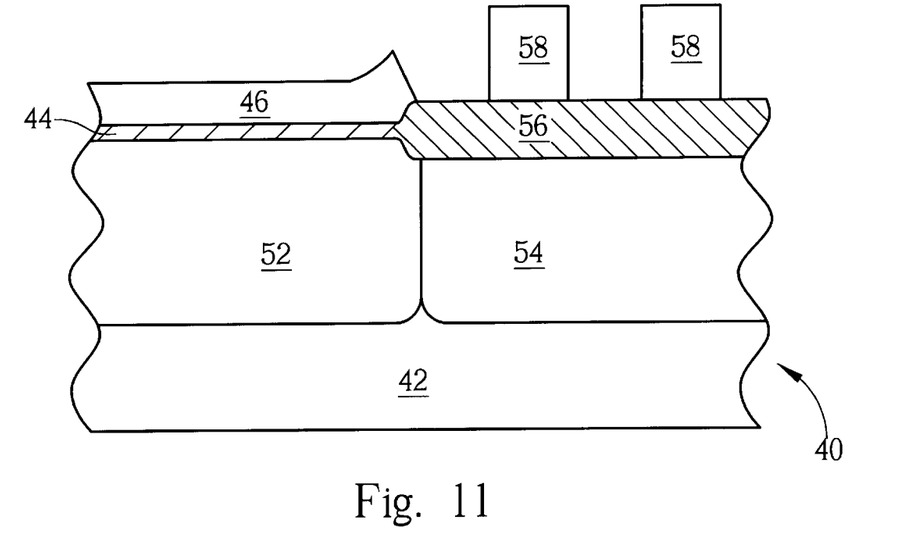
Figure 12:
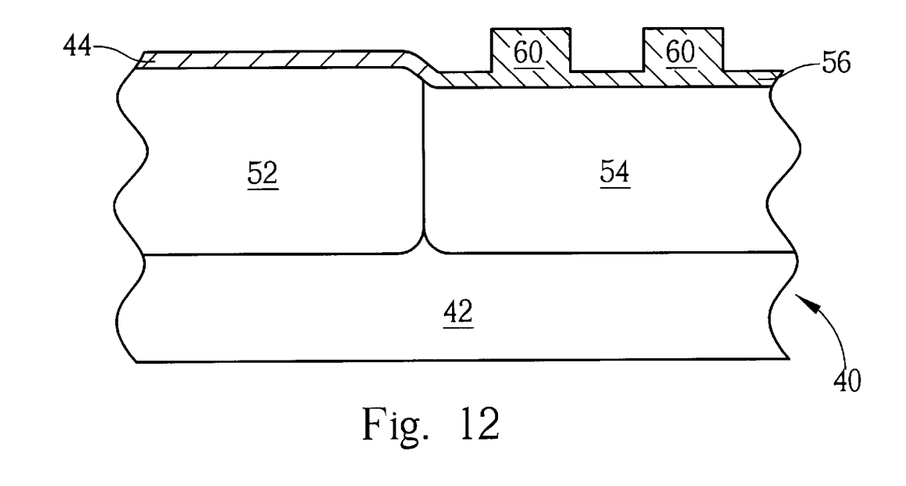

As shown in FIG. 10, the semiconductor wafer 40 is placed in the presence of water and oxygen and undergoes a thermal oxidation process. A field oxide layer 56 is formed on the area not covered by the silicon nitride layer 46, and the p-type dopants and the n-type dopants are simultaneously driven into the silicon substrate so as to form the p-well 52 and the n-well 54. As shown in FIG. 11, a photoresist layer 58 is coated onto the field oxide layer 56, and a lithographic process is performed to define the area of insulation layers 60. Those portions of the photoresist layer 58 that are not in the area of the insulation layers 60 are removed. Using the residual photoresist layer 58 as a mask, a dry etching process is performed to form the insulation layers 60. Using heated phosphoric acid as an etching solution, the photoresist layer 58 and the silicon nitride layer 46 are completely stripped, as shown in FIG. 12.

Figure 13:
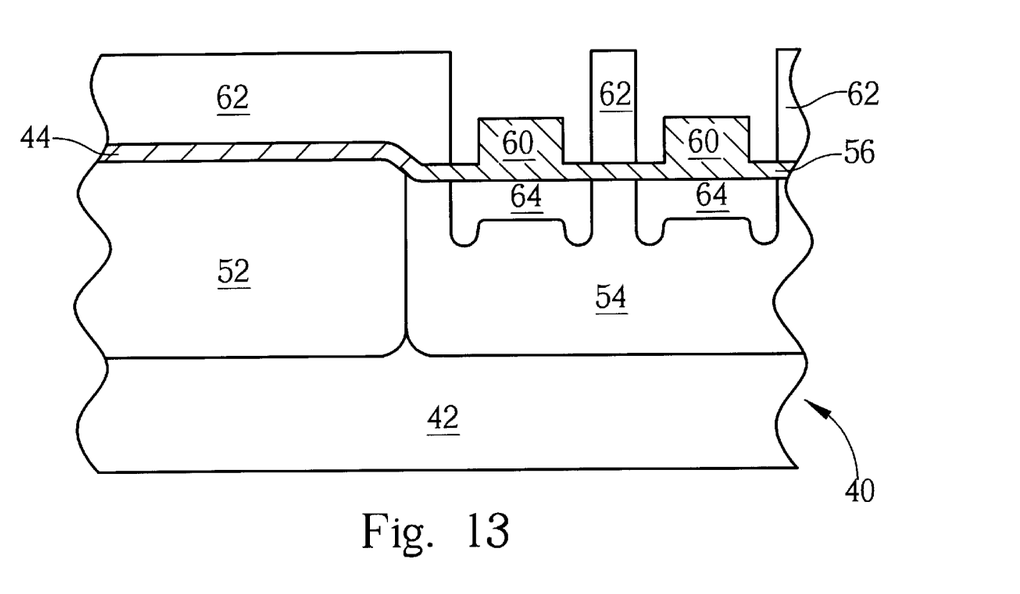
Figure 14:
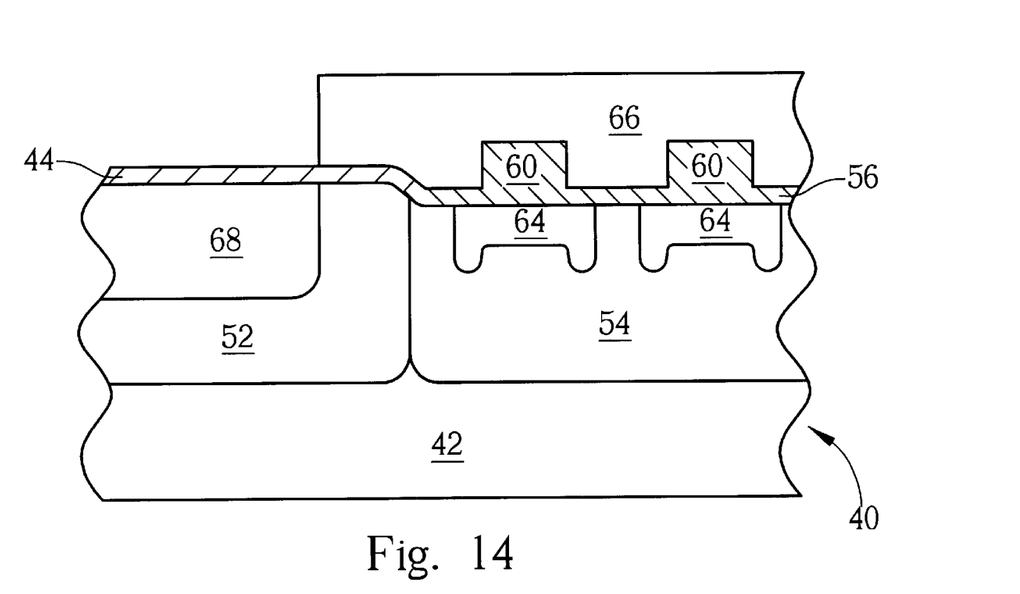

As shown in FIG. 13, a photoresist layer 62 is formed on the wafer 40. A lithographic process is performed to form openings in the photoresist layer above the n-well 54 so as to define areas in the n-well 54 around the insulation layers 60. An ion implantation process is then performed through the openings to form n-wells 64 of higher dosage dopants. The photoresist layer 62 is then stripped. As shown in FIG. 14, a lithographic process and an ion implantation process are performed again to form a p-well 68 of higher dosage dopants than the p-well 52 that surrounds the p-well 68. The photoresist layer 66 is stripped. Because the high energy ions used in the ion implantation processes destroy the structure of the silicon atoms and transform the crystalline silicon into amorphous silicon, the semiconductor wafer 40 is placed into a thermal furnace to perform an annealing process at temperatures of about 800 to 1000° C. so as to promote conductivity.

Figure 15:
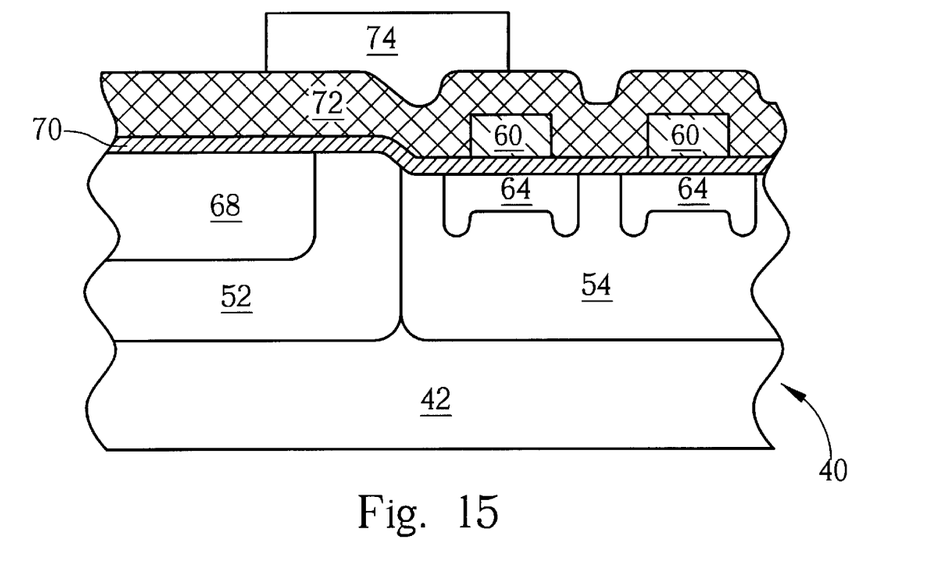

As shown in FIG. 15, a wet etching process is performed to completely remove the residual silicon oxide layer 44. Then a cleaning process is performed on the silicon surface, which had suffered atmospheric exposure, to ensure its quality. After the cleaning process, the wafer 40 is again placed into a thermal oxidation furnace to form a silicon oxide layer 70, around 100 to 250 angstroms thick, using a dry oxidation process. A polysilicon layer 72, around 2000 to 3000 angstroms thick, is deposited onto the silicon oxide layer 70 using an LPCVD process. A thermal diffusion method, or an ion implantation process, is then performed to heavily dope the polysilicon layer 72 so as to reduce its resistivity. Then a photoresist layer 74 is used to define the area of a gate layer 80 (FIG. 16).

Figure 16:
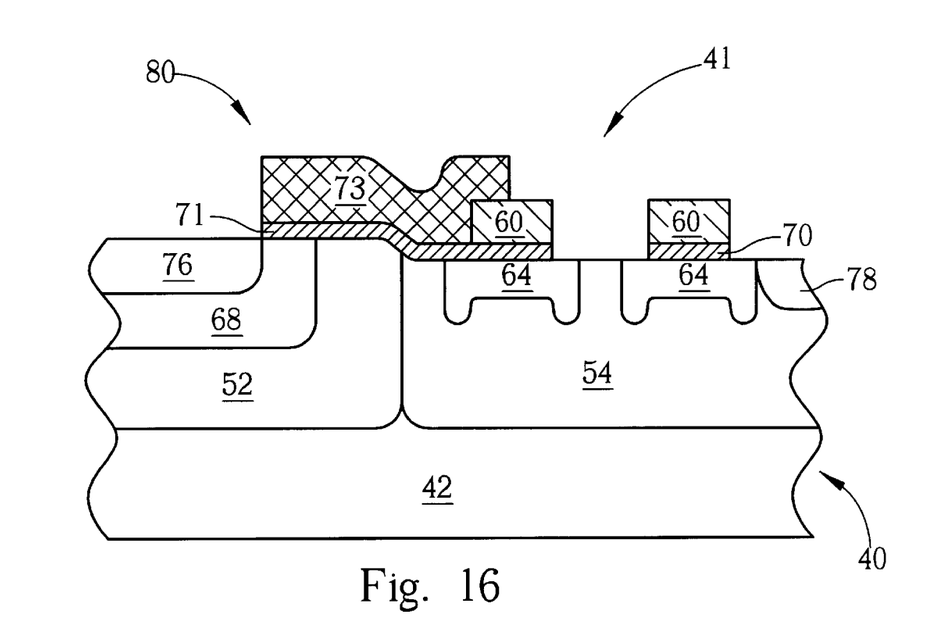

As shown in FIG. 16, a dry etching process is performed to remove the polysilicon layer 72 and the silicon oxide layer 70 in the areas that are not covered by the photoresist layer 74. The photoresist layer 74 is then stripped. After the etching process is performed, the residual polysilicon layer 72 forms a gate conductive layer 73, and the residual silicon oxide layer 70 forms a gate oxide layer 71. The gate layer 80 comprises the gate oxide layer 71 and the doped polysilicon gate conductive layer 73. Also, the gate layer 80 is positioned on a portion of the p-well 52 and the n-well 54, and one side of the gate layer 80 is positioned on the surface of the insulation layer 60. Photolithography processes and ion implantation processes are performed to form n-type doped regions 76 and 78 that are both of high dosage dopants on the p-well 68 and the n-well 54, respectively. The n-type doped regions function as the source and the drain of the LD MOS transistor 41.

In typical high-voltage units, the on-resistance of the gate is related to the channel length of the LD MOS transistor. And the channel length, which is defined as the length from the source to the drain of the LD MOS transistor, is related to the length of the drift region. In the present invention LD MOS transistor 41, the n-type doped region 76 used as the source is adjacent to one side of the gate layer 80, and the n-type doped region 78 used as the drain is formed adjacent to the n-well 64 which is just under the insulation layer 60. Therefore, the channel length of the LD MOS transistor 41 is determined by the two lithographic processes that define the area of the n-type doped regions 76 and 78. As a result, the channel length, and its associated on-resistance, of the LD MOS transistor 41 can be precisely controlled. In other words, the channel length of the LD MOS transistor 41 is controlled using the self-aligned method during the formation of the n-type doped regions 76 and 78. The channel length in the prior art is determined by the length of the field oxide layer 56, and so is not well controlled. The channel length in the present invention is determined by the insulation layer 60 of a predetermined scale, so the channel length can be controlled precisely, and thus the on-resistance of the gate layer 80 can be precisely controlled.

In addition, the threshold voltage of both the prior art and present invention LD MOS transistors must be adjusted by increasing the doping on the surface of the wafer after completing the formation of the transistor. In the present invention LD MOS transistor 41, the p-well 52 and the n-well 54 are both formed of low dosage dopants. That will make electrical breakdowns that are due to heavy loading occur in the region near the silicon substrate 42 so as to prevent destruction of the LD MOS transistor 41. In addition, the p-well 68 and the n-well 64 are both formed of high dosage dopants, which can enhance both the current, and the magnitude of the electrical field. As a result, the electrical performance of the LD MOS transistor is improved.

In contrast to the prior art LD MOS transistor, the channel length of the present invention LD MOS transistor is controlled precisely by the self-aligned method during the formation of the p-well and the n-well. The channel length is no longer determined by the length of the field oxide layer. Therefore, the on-resistance of the LD MOS transistor can be precisely controlled so as to enhance the electrical performance of the LD MOS transistor.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a lateral diffused metal-oxide semiconductor (LD MOS) transistor on a semiconductor wafer, the surface of the semiconductor wafer comprising a silicon substrate, a first p-well and a first n-well both positioned on the silicon substrate and the first p-well being adjacent to the first n-well, the method comprising:

forming an insulation layer on a predetermined area of the first n-well;

forming a gate layer positioned on a portion surface of the first p-well and the first n-well, a side of the gate layer positioned on the surface of the insulation layer;

performing a first ion implantation process to form a second p-well on a predetermined area of the first p-well;

performing a second ion implantation process to form at least a second n-well under the insulation layer on a predetermined area of the first n-well; and performing a third ion implantation process to form a doped region positioned on the second p-well and a doped region positioned on the first n-well, the two doped regions functioning as source and drain of the LD MOS transistor.

2. The method of claim 1 wherein the method of forming the insulation layer comprises:

forming a silicon oxide layer on the surface of the first n-well;

forming a silicon nitride layer on the silicon oxide layer;

performing a lithographic process to remove the silicon nitride layer above the first n-well;

performing a thermal oxidation process using the remaining silicon nitride layer acting as a mask in the thermal oxidation process to form a field oxide layer on the first n-well;

forming a photoresist layer on the field oxide layer;

performing a lithographic process to define an area of the insulation layer on the field oxide layer and to remove the photoresist layer which is not above the area;

performing an etching process using the residual photoresist layer as a mask to remove the portion of the field oxide layer not covered by the mask so as to form the insulation layer in the area;

removing the photoresist layer completely; and removing the silicon nitride layer.

3. The method of claim 2 wherein the etching process is either a dry etching process or a wet etching process.

4. The method of claim 1 wherein the gate layer comprises a gate oxide layer and a doped polysilicon layer formed on the gate oxide layer.

5. A method of forming a lateral diffused metal-oxide semiconductor (LD MOS) transistor on a semiconductor wafer, the surface of the semiconductor wafer comprising a silicon substrate, the method comprising:

forming a silicon oxide layer on the surface of the silicon substrate;

performing a first ion implantation process to form a first p-type doped region on a predetermined area of the silicon substrate;

forming a silicon nitride layer on the silicon oxide layer;

performing a lithographic process to define an ion implantation area of a first n-well and to remove the silicon nitride layer on the ion implantation area;

performing a second ion implantation process using the silicon nitride layer as a mask to form a first n-type doped region on the ion implantation area of the silicon substrate;

performing a thermal oxidation process to form a field oxide layer on the region that is not covered by the silicon nitride layer and to drive the dopants of the first p-type doped region and the first n-type doped region into the silicon substrate so as to form a first p-well and the first n-well, and the first p-well being adjacent to the first p-well;

forming an insulation layer on a predetermined area of the first n-well;

forming a gate layer positioned on a portion surface of the first p-well and the first n-well, a side of the gate layer positioned on the surface of the insulation layer; and performing a third ion implantation process to form an second n-type doped region on the first p-well and a third n-type doped region on the first n-well, the second and the third n-type doped regions functioning as source and drain of the LD MOS transistor.

6. The method of claim 5 wherein after finishing the thermal oxidation process the method of forming the insulation layer comprises:

forming a photoresist layer on the field oxide layer;

performing a lithographic process to define an area of the insulation layer on the field oxide layer and to remove the photoresist layer which is not above the area;

performing an etching process using the residual photoresist layer as a mask to remove portion of the field oxide layer so as to form the insulation layer in the area;

removing the photoresist layer completely; and removing the silicon nitride layer.

7. The method of claim 6 wherein the etching process is either a dry etching process or a wet etching process.

8. The method of claim 5 wherein the first n-well also comprises a second n-well positioned on a predetermined area of the first n-well.

9. The method of claim 8 wherein the method of forming the second n-well comprises:

forming a photoresist layer on the first n-well;

performing a lithographic process to form an opening in the photoresist layer above the first n-well so as to define the position of the second n-well;

performing an n-type ion implantation process through the opening to form the second n-well on the first n-well; and removing the photoresist layer completely.

10. The method of claim 5 wherein the first p-well also comprises a second p-well positioned on a predetermined area of the first p-well.

11. The method of claim 5 wherein the gate layer comprises a gate oxide layer and a doped polysilicon layer formed on the gate oxide layer.

* * * * *